United States Patent
Hashimoto et al.

(10) Patent No.: US 7,985,981 B2
(45) Date of Patent: Jul. 26, 2011

(54) SEMICONDUCTOR LIGHT-EMITTING DEVICE

(75) Inventors: Rei Hashimoto, Tokyo (JP); Yasushi Hattori, Kawasaki (JP); Takahiro Sato, Kawasaki (JP); Jongil Hwang, Kawasaki (JP); Maki Sugai, Tokyo (JP); Yoshiyuki Harada, Tokyo (JP); Shinji Saito, Yokohama (JP); Shinya Nunoue, Ichikawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 12 days.

(21) Appl. No.: 12/638,354

(22) Filed: Dec. 15, 2009

(65) Prior Publication Data

US 2010/0148203 A1  Jun. 17, 2010

(30) Foreign Application Priority Data

Dec. 17, 2008 (JP) ................. 2008-321406

(51) Int. Cl.
*H01L 33/00* (2010.01)
*H01L 33/58* (2010.01)

(52) U.S. Cl. .................. 257/98; 257/712; 257/E33.068; 362/259; 362/311.02; 313/502; 372/80

(58) Field of Classification Search ............. 257/98, 257/712, E33.068; 362/259, 293, 294, 311.02, 362/311.06; 372/80; 313/502
See application file for complete search history.

(56) References Cited

U.S. PATENT DOCUMENTS

| | | | | |
|---|---|---|---|---|
| 7,161,567 B2* | 1/2007 | Homma et al. | .......... | 345/82 |
| 7,391,153 B2* | 6/2008 | Suehiro et al. | .......... | 313/512 |
| 7,550,319 B2* | 6/2009 | Wang et al. | .......... | 438/125 |
| 7,781,787 B2* | 8/2010 | Suehiro et al. | .......... | 257/98 |
| 2007/0075306 A1* | 4/2007 | Hayashi et al. | .......... | 257/13 |
| 2009/0185589 A1 | 7/2009 | Hattori et al. | | |

FOREIGN PATENT DOCUMENTS

| | | |
|---|---|---|
| JP | 2927279 | 5/1999 |
| JP | 2003-142737 | 5/2003 |
| JP | 2004-111882 | 4/2004 |
| JP | 2004-119634 | 4/2004 |
| JP | 2005-152131 | 6/2005 |
| JP | 2008-21973 | 1/2008 |
| JP | 2008-186850 | 8/2008 |
| WO | WO 2008/105527 A1 | 9/2008 |

OTHER PUBLICATIONS

U.S. Appl. No. 12/729,636, filed Mar. 23, 2010, Hattori, et al.
U.S. Appl. No. 12/874,778, filed Sep. 2, 2010, Saito, et al.
U.S. Appl. No. 12/876,675, filed Sep. 7, 2010, Hattori, et al.
U.S. Appl. No. 12/876,774, filed Sep. 7, 2010, Hattori, et al.
U.S. Appl. No. 12/876,738, filed Sep. 7, 2010, Hattori, et al.
Office Action issued Oct. 19, 2010, in Japan Patent Application No. 2008-321406 (with English-language Translation).
U.S. Appl. No. 12/493,585, filed Jun. 29, 2009, Yasushi Hattori et al.

\* cited by examiner

*Primary Examiner* — David Vu
*Assistant Examiner* — Earl N Taylor
(74) *Attorney, Agent, or Firm* — Oblon, Spivak, McClelland, Maier & Neustadt, L.L.P.

(57) ABSTRACT

There is provided a semiconductor light-emitting device including a semiconductor light-emitting element, a phosphor layer disposed in a light path of a light emitted from the semiconductor light-emitting element, containing a phosphor to be excited by the light and having a cross-section in a region of a diameter which is 1 mm larger than that of a cross-section of the light path, and a heat-releasing member disposed in contact with at least a portion of the phosphor layer and exhibiting a higher thermal conductance than that of the phosphor layer.

19 Claims, 2 Drawing Sheets

# SEMICONDUCTOR LIGHT-EMITTING DEVICE

CROSS-REFERENCE TO RELATED APPLICATIONS

This application is based upon and claims the benefit of priority from prior Japanese Patent Application No. 2008-321406, filed Dec. 17, 2008, the entire contents of which are incorporated herein by reference.

BACKGROUND OF THE INVENTION

1. Field of the Invention

This invention relates to a semiconductor light-emitting device which is designed to enable a phosphor to emit light by irradiation with excitation light from a semiconductor light-emitting element and, in particular, to a semiconductor light-emitting device which employs a high-output semiconductor light-emitting element.

2. Description of the Related Art

In recent years, many attentions have been paid to a solid-state white light source consisting of a small semiconductor light-emitting device which is capable of emitting white light and includes a semiconductor light-emitting element employing a GaN type III-Group nitride semiconductor and enabled to emit near ultraviolet ray, bluish violet ray, blue ray, etc., is used as an excitation light source and part or all of the excitation light is converted into a light having a different wavelength by irradiation with the excitation light to a phosphor so as to emit white light. Since the solid-state white light source employing a semiconductor light-emitting element as an excitation light source as described above has characteristics such as low power consumption and long life, the solid-state white light source is utilized in various fields such as general lighting, on-vehicle lighting, a back light source for liquid crystal, etc.

In the case of the solid-state white light source using a combination of the aforementioned semiconductor light-emitting element and a phosphor, there is an increasing trend to adopt generally inexpensive light-emitting diodes (LED) for use as a semiconductor light-emitting element to be employed as an excitation light source (for example, JP-A 2003-142737). However, if it is tried to obtain the same or higher degree of luminescence as that of general lighting such as a fluorescent lamp or an incandescent lamp by making use of the existing LED-excited white light source, it is required to employ a plural number of LED-excited white light sources. Under the circumstances, various researches for improving the characteristics of solid-state white light source are now being studied, such researches including the development of a large area LED for the purpose of enhancing the output per chip, the improvement of light-emitting efficiency and output, the miniaturization of module size, the improvement of color rendering, the abatement of color shading, etc. (for example, JP-A 2004-119634).

Meanwhile, in view of increasing the light-emitting output, it is conceivable to employ, as an excitation light source for the solid-state white light source, not the LED but a laser diode (LD). Since this LD is higher in output and also higher in conversion efficiency on injecting high electric current as compared with the LED, it is expected to realize a small and high output solid-state white light source.

However, when this high output semiconductor light-emitting element is employed as an excitation light source, it may give rise to the problems that the properties of the semiconductor light-emitting element and of the phosphor may be deteriorated due to the influence of heat generation on operating the semiconductor light-emitting device. As a matter of fact, it is now studied to develop a structure wherein the heat releasing property is taken into account when employing a high output semiconductor light-emitting element though an LED is employed as the high output semiconductor light-emitting element in this case (see JP 2927279).

However, as described above, since LEDs which are designed to be driven with low electric current are mainly employed as an excitation light source in the case of the ordinary solid-state white light-emitting device, there are almost no studies reported so far on the influence of heat generation when using an high output semiconductor light-emitting element, especially an LD to be driven with a large driving current.

BRIEF SUMMARY OF THE INVENTION

An object of the present invention is to provide a semiconductor light-emitting device which is capable of suppressing the increase of temperature that may be caused due to the development of heat in a phosphor as the phosphor is excited by the excitation light from a high output semiconductor light-emitting element, thereby making it possible to avoid serious deterioration of conversion efficiency as well as the denaturing of the phosphor.

According to one aspect of the present invention, there is provided a semiconductor light-emitting device comprising: a semiconductor light-emitting element; a phosphor layer disposed in a light path of a light emitted from the semiconductor light-emitting element, containing a phosphor to be excited by the light and having a cross-section in a region of a diameter which is 1 mm larger than that of a cross-section of the light path; and a heat-releasing member disposed in contact with at least a portion of the phosphor layer and exhibiting a higher thermal conductance than that of the phosphor layer.

DETAILED DESCRIPTION OF THE INVENTION

Figure 1:
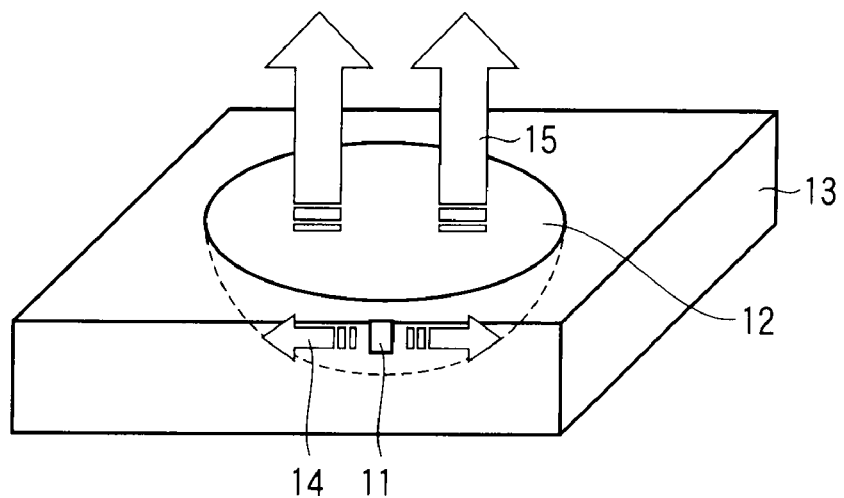
FIG. 1 is a diagram schematically illustrating the construction of a semiconductor light-emitting device wherein an LD is employed as an excitation light source.

There will be described the embodiments of the present invention.

As a result of extensive studies made by the present inventors, it has been found out that, when the solid-state white light source including an LD as an excitation light source is employed, the heat release amount from a phosphor becomes relatively large as it is strongly excited by a high-output LD beam in addition to the conventionally recognized heat release from a semiconductor light-emitting element which is employed as an excitation light source and that due to this heat release from a phosphor, the temperature of the phosphor as well as the temperature of the base material containing the phosphor is caused to increase, thereby raising serious problems such as the deterioration in properties of the phosphor and also the degradation or breakage of the phosphor.

Next, the aforementioned problems of heat release that have been found out by the present inventors will be explained.

In the case of the conventional solid-state white light source which utilizes the LED as a semiconductor excitation light source and is designed to obtain white light through the wavelength conversion occurring by irradiation of excitation light with a phosphor, the peripheral circumference of the LED is covered with a layer containing the phosphor. Part or all of the light that has been emitted from the LED is converted in wavelength by surrounding phosphor, thereby enabling it to emit white light to the exterior of the semiconductor light-emitting element. In this case, as a material for the LED, a III-Group nitride semiconductor which is capable of emitting near ultraviolet ray, bluish violet ray, blue ray is employed in general. This LED is provided, at its bottom, with a heat releasing member for dissipating the heat to be generated on driving the LED. The operating current of the LED is confined to 10-40 mA and the output of the LED light on this occasion is generally confined to 10-30 mW or so.

Even in the case of the light-emitting device where the LED having properties of low driving current and low output is employed as an excitation light source, the release of heat from the LED as it is driven cannot be disregarded, giving rise to the deterioration of the light-emitting efficiency of the LED and of the phosphor. For this reason, in order to secure the light-emitting efficiency thereof, a heat-releasing structure is applied to a bottom of the LED. Furthermore, in order to prevent the heat generated from the LED from being transmitted to the layer of phosphor to thereby prevent the deterioration of the phosphor, it is generally practiced to cover the region in the vicinity of the LED with a transparent resin containing no phosphor and to dispose the phosphor layer at a location spaced away several millimeters from the LED.

As described above, in the case of the conventional LED excitation light source, a large number of countermeasures have been taken with respect to the generation of heat from the LED.

Meanwhile in this case, when the fact that the output light of LED outgoes omnidirectionally is taken into account, the output density of the LED light to the phosphor layer which is spaced away 3 mm for example from the LED would become about 0.5 mW/mm$^2$. As long as the phosphor is excited with such a weak optical output density as described above, the heat generation from the phosphor itself would be quite negligible. Because of this, the studies on the heat generation from the phosphor layer have been scarcely conducted in the development of the conventional low output LED excitation light source. However it has found out by the present inventors that in a case where the excitation light source is a high output light source such as the LD, the heat release value to be generated from the phosphor increases substantially, giving serious influences to the properties of the semiconductor light-emitting element.

The phosphor is a material which is capable of absorbing excitation light from an excitation light source, converting it into a light of the other wavelength and emitting the light. The conversion efficiency of the phosphor on this occasion depends on the absorbance thereof to excitation light, on the internal quantum efficiency and on the Stokes shift. Herein, the internal quantum efficiency represents an extent of how high degree the excitation light that has been absorbed can be converted into a light of the other wavelength. Generally, phosphors having an internal quantum efficiency of 50-80% are utilized. On this occasion, 20-50% of the excitation light that has been failed to be converted into a light of the other wavelength is turned mainly into thermal energy and hence becomes a loss.

In the case of the aforementioned LED-excited white light source for example, even if all of the excitation light having an output of 10-40 mW has been absorbed, if the internal quantum efficiency of the phosphor is assumed as being 80%, the remaining 20% thereof is caused to become heat loss, thereby giving rise to the generation of a heat amount of 2-8 mW at the excited phosphor layer. Since the output light of LED outgoes omnidirectionally, the excited phosphor layer is permitted to exist as dome-like configuration and the temperature rise of the phosphor layer, when calculated according to the aforementioned heat amount, is confined to not higher than 3° C. Namely, as long as the temperature rise is confined to this degree, the properties of the semiconductor light-emitting element can be hardly affected.

However, when the light source is of high output, the influence of the temperature rise becomes serious. Next, there will be explained about the case assuming that the excitation light source of the aforementioned LED-excited white light source is replaced from the LED to the LD.

The construction of the white light emitting device employing the LD as an excitation light source is the same as the construction of the white light emitting device where the LED is employed as an excitation light source. In this case, only the excitation light source is changed from the LED to a III-Group nitride LD which is enabled to emit near ultraviolet ray, bluish violet ray or blue ray and the peripheral circumference of the LD is semi-spherically covered with a layer containing a phosphor. A heat-releasing member is disposed below the LD, so that the heat generated from the LD itself can be sufficiently released.

In view of using the LD as a white light source, the operating current of the LD is frequently confined to 200-1500 mA and the LD light output on this occasion is frequently confined to 200-3000 mW. As in the case of the aforementioned example, if the output light of LD outgoes omnidirectionally and the internal quantum efficiency of the phosphor is assumed as being 80%, a heat amount of about 40-600 mW is caused to generate in the entire body of the excited phosphor layer. The LD light is directive, so that the LD light radiates with a narrow divergent angle from the end face of the LD. Because of this, the excited phosphor layer by this LD light is existed in a cone-like configuration.

When the divergent angle of the LD light to be employed in this embodiment is represented by a full width at half maximum of the light output distribution, it is about 20 degrees in the vertical direction and about 40 degrees in the lateral direction. The light output density of the LD light in the phosphor layer that is being excited with this configuration is confined to about 20-4000 mW/mm$^2$, indicating that the phosphor layer is very strongly excited as compared with the excitation to be effected by the aforementioned LED. It has been found out through calculation that, due to the heat amount generated from the excited phosphor, the temperature of the excited phosphor layer can be increased up to about 50-800° C.

Generally speaking, as the temperature of phosphor is increased, the conversion efficiency thereof is caused to decrease. Although the degree of the decrease in conversion efficiency differs variously depending on the kind of the phosphor, the conversion efficiency is lowered by not less than 20% as the temperature of phosphor is increased by 100° C. There are many kinds of phosphors exhibiting a decrease of 50-80% in conversion efficiency as the temperature thereof is increased by 300° C. Furthermore, when the temperature of phosphor increases by more than 300° C., the property changes, degradation or breakage of the resin constituting the base material containing a phosphor may be caused to occur. In view of these facts, when the temperature of phosphor layer is increased by several hundreds degrees, the conversion efficiency of the phosphor employed as a light-emitting element would be prominently decreased and, furthermore, the denaturing or deterioration of the phosphor layer may be caused to occur. Namely, it will be recognized that when the white light-emitting device is constructed as described above, it is difficult to obtain a high-output white light by the high-output driving of LD-excited white light source.

As described above, it has been found out by the present inventors that when an excitation light source of high output is employed, the heat amount to be generated from the excited phosphor may become a cause for a prominent increase in temperature of the phosphor layer, giving rise to a serious problem that the properties of the light-emitting device may be seriously affected.

Followings are explanations about how the aforementioned problems have been solved by the means provided by the present invention.

As described above, as long as the LD-excited white light source is manufactured so as to have the same structure as generally employed in the manufacture of the conventional LED-excited white light source, it will invite a great increase in temperature of the phosphor layer, the prominent degradation of properties thereof as well as the denaturing and breakage of material, thereby making it difficult to operate the white light emitting device with high output and high efficiency.

In order to solve the problems concerning the aforementioned heat generation and temperature rise that have been obtained as new findings in the manufacture of a solid-state white light source where the LD is employed as an excitation light source, it is required to sufficiently secure not only the heat-releasing property of the excitation light source that has been conventionally considered as being important problem but also the heat-releasing property of the phosphor layer that has been newly found out as being a heat-generating source. With a view to achieve these objects, the present inventors have found out the structure of semiconductor light-emitting device as shown in FIG. 1.

The semiconductor light-emitting device shown in FIG. 1 is constructed such that an LD 11 is used as an excitation light source, that a phosphor layer 12 is disposed to surround the LD 11 and that the entire surface of the phosphor layer 12 excluding the top surface thereof is covered with a heat-releasing block 13. Namely, a semi-spherical recessed portion is formed on the upper surface of the heat-releasing block 13 made of a heat-releasing member, and the LD 11 used as an excitation light source is disposed at a central portion of the recessed portion, the remaining recessed portion surrounding the LD 11 being filled with phosphor layer 12.

It has been confirmed by the present inventors that even in the case of the semiconductor light-emitting device employing the LD 11 as an excitation light source and having a structure as shown in FIG. 1, it is possible to decrease the temperature of the phosphor layer during the operation thereof. However, the semiconductor light-emitting device constructed in this manner was found insufficient in decreasing the temperature of the phosphor layer during the operation thereof as the excitation light source was driven with an high output, thus permitting the temperature of the phosphor layer to exceed more than 200° C. and resulting in a prominent deterioration in light-emitting efficiency of the device.

It has been found out as a result of the profound studies and researches performed by the present inventors on the positional relationship between the phosphor layer which is low in thermal conductance and the heat-releasing member which is high in thermal conductance that when the phosphor layer is formed only in the light path of excitation light or in the vicinity thereof, it is possible to remarkably suppress the increase in temperature of the excited phosphor layer.

Figure 2:
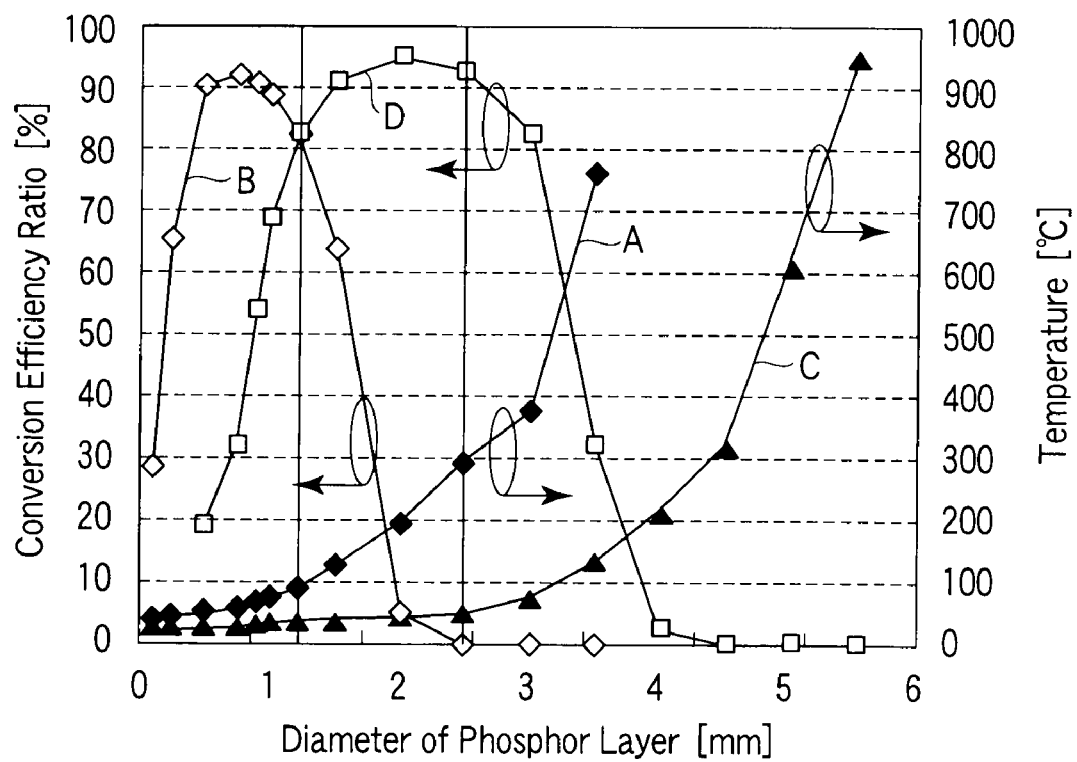
FIG. 2 is a graph for illustrating the dependency of the temperature of a phosphor layer being excited on a distance between an excitation region and a heat-releasing member.

FIG. 2 illustrates the relationship among the diameter of the phosphor layer, the temperature of the phosphor layer and the conversion efficiency of the device (a ratio as compared with the case where the operating temperature of the device is room temperature), this relationship being found out by the present inventors. As described above, when the excitation light is high in output as in a case where the excitation light source is a high-output LD, the heat generation from the phosphor layer becomes high, thus prominently increasing the temperature of the phosphor layer and resulting in the deterioration in light-emitting efficiency of the device. FIG. 2 graphs out the relationship between the temperature of the phosphor layer as the diameter thereof was altered and the conversion efficiency of a light-emitting device at the operation temperature thereof, wherein an LD having a lighting output of 2 W was used as an excitation light source, and the phosphor layer provided with a heat-releasing member exhibiting a large thermal conductance on the peripheral circumference thereof, was excited to obtain white light.

Figure 3:
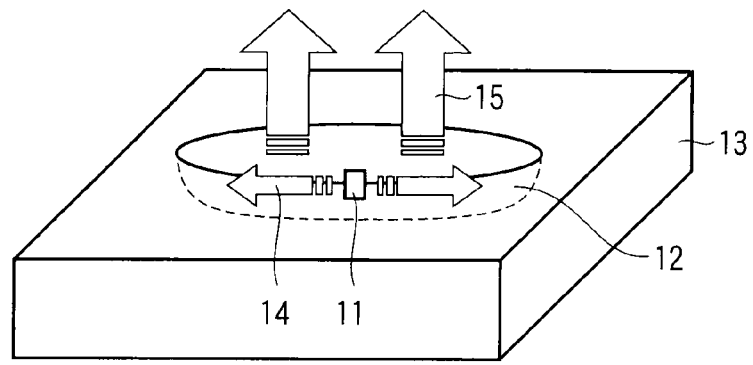
FIG. 3 is a diagram schematically illustrating the construction of a semiconductor light-emitting device according to a first embodiment of the present invention.

In this FIG. 2, the temperature and conversion efficiency of a portion of the phosphor layer which is located 2 mm away from the end face of the LD are indicated by curve A and curve B, respectively, and the temperature and conversion efficiency of another portion of the phosphor layer which is located 4 mm away from the end face of the LD are indicated by curve C and curve D, respectively. In this case, the diameter of the light path of excitation light coincides with the diameter of the phosphor layer when the diameter of the phosphor layer is about 1.2 mm at the location which is 2 mm spaced away from the end face of the LD. Likewise, the diameter of the light path of excitation light coincides with the diameter of the phosphor layer when the diameter of the phosphor layer is about 2.5 mm at the location which is 4 mm spaced away from the end face of the LD. FIG. 3 illustrates a schematic view of the LED-excited white light source which was used in this examination.

The semiconductor light-emitting device shown in FIG. 3 is constructed such that an LD 11 is used as an excitation light source, that a phosphor layer 12 is disposed along the light path of the LD 11 and that the entire surface of the phosphor layer 12 excluding the top surface thereof is covered with a heat-releasing block 13. Namely, a semi-spherical or boat-like recessed portion is formed on the upper surface of the heat-releasing block 13 made of a heat-releasing member, and the LD 11 used as an excitation light source is disposed at a central portion of the recessed portion, the remaining recessed portion surrounding the LD 11 being filled with phosphor layer 12.

From the graph of FIG. 2, the manner and magnitude of increase in temperature due to the generation of heat in the phosphor layer 12 that has been excited by the excitation light will be recognized. Namely, as the diameter of the phosphor layer 12 increases, the temperature of the phosphor layer 12 becomes higher, thus lowering the conversion efficiency of the light-emitting device. When the diameter of the phosphor layer 12 becomes larger by 1 mm than that of the light path of the excitation light, the temperature of the phosphor layer 12 increases beyond 100° C., resulting in a prominent decrease in conversion efficiency of the device. As the diameter of the phosphor layer 12 becomes smaller, the temperature rise can be correspondingly suppressed, resulting also in the suppression of the lowering of the conversion efficiency of the light-emitting device. However, if it is desired to secure a conversion efficiency of not less than 90% on the occasion of operating the device at room temperature, it is more preferable to narrow the phosphor layer 12 rather than decreasing the diameter of the light path of the excitation light.

For example, when it is examined at a location which is 2 mm away from the end face of the LD 11, as the diameter of the phosphor layer 12 is 0.6 mm which is about a half of the light path of excitation light, the conversion efficiency of the light-emitting device becomes the highest. If the diameter of the phosphor layer 12 is smaller than that of the light path of excitation light, it may become more difficult to enable the excitation light to enter into the phosphor layer 12, thereby making it impossible to sufficiently excite the phosphor layer 12, resulting possibly in the lowering of the conversion efficiency of the light-emitting device. As a matter of fact, when the diameter of phosphor layer 12 was smaller than 0.4 mm, the conversion efficiency of the light-emitting device was deteriorated. However, it has been found out by the present inventors that, as apparent from the graph shown in FIG. 2, when the size (diameter) of the phosphor layer 12 is confined to not larger than the size of the light path of excitation light, the conversion efficiency of the light-emitting device becomes the highest.

Namely, a first characteristics of the light-emitting device according to one embodiment of the present invention resides in the features that the phosphor layer 12 is formed so as to have a cross-section which is located inside the light path of excitation light, i.e. within the cross-sectional region of light path of excitation light and that a heat-releasing member exhibiting a higher thermal conductance than that of the phosphor layer is disposed in contact with the peripheral circumference (excluding the top surface) of the phosphor layer 12. When the phosphor layer 12 is constructed in this manner, it is possible to operate the light-emitting device so as to realize high efficiencies and high outputs even if a high-output semiconductor light source is employed as an excitation light source.

When the phosphor layer 12 is formed thicker than the light path of excitation light, the conversion efficiency of the light-emitting device will be deteriorated as the diameter of the phosphor layer 12 becomes larger. It will be recognized from the graph of FIG. 2 that when the diameter of the phosphor layer 12 is made more than 1 mm larger than that of the light path of excitation light, the conversion efficiency of the light-emitting device will be prominently deteriorated, thus contradicting to the object of functioning the light-emitting device at a high efficiency. However, if the output of the excitation light is as low as 200 mW-1 W or so, the conversion efficiency would not be deteriorated so much even if the diameter of the phosphor layer 12 is increased. For example, the conversion efficiency may be greatly deteriorated only when the diameter of the phosphor layer 12 is made not less than 2 mm larger than that of the light path of excitation light. Further, when the output of the excitation light is as low as less than 200 mW or so, the heat amount to be generated from the phosphor layer will be confined to a small degree so that the aforementioned problem would not be raised.

The temperature rise of the phosphor layer 12 depends on the light density of excitation light. In the explanation discussed above, the temperature and the conversion efficiency of the phosphor layer 12 as the phosphor layer 12 is located 2 mm and 4 mm away from the end face of the LD 11 employed as an excitation light source have been studied. However, if the phosphor layer 12 is located very close to the end face of the LD 11, the density of excitation light will be extremely increased, so that even if the size of the phosphor layer 12 is confined to the aforementioned range, the temperature rise of phosphor layer 12 cannot be suppressed, thus resulting in prominent decrease of the light-emitting efficiency of the light-emitting device. Therefore, in order to suppress the deterioration in light-emitting efficiency of the light-emitting device by the aforementioned countermeasures, the density of the excitation light entering into the phosphor layer 12 should be restricted. Although it is conceivable to employ a method to suppress the output of the semiconductor light-emitting element employed as an excitation light source, such a method is not preferable since the object of the present invention resides in the realization of the white light source wherein a high-output semiconductor light-emitting element is employed as an excitation light source.

It has been found out as a result of the extensive studies made by the present inventors that if the phosphor layer 12 is disposed at a position where the density of the excitation light is higher than 1000 mW/mm$^2$, it is difficult to suppress the temperature rise of phosphor layer 12 even if the aforementioned countermeasures are adopted, resulting in the achievement of a very low level of the conversion efficiency of the light-emitting device. Therefore, as another embodiment, it is preferable to position the phosphor layer 12 only at a region where the density of the excitation light is not higher than 1000 mW/mm$^2$. Specifically, it is preferable to adopt a structure wherein the phosphor layer 12 is not formed very close to the end face of the LD 11 employed as an excitation light source but is formed in a region where the density of the excitation light decreases down to 1000 mW/mm$^2$ or less as the LD light propagates.

It is preferable to dispose a layer containing no phosphor such as a transparent resin layer made of glass, sintered body, ceramic material, air, water, etc. As explained above, by the term phosphor layer 12, it means a layer which is capable of sufficiently absorbing an excitation light and contains a phosphor at such a concentration that brings about problems of heat generation during the emission of fluorescence, so that a layer which contains a very small amount of phosphor is excluded from the definition of the phosphor layer. When the concentration of phosphor contained in the phosphor layer is very low, the emission of fluorescence will be minimal and hence the heat amount to be generated therefrom will be also minimal. Therefore, even if such a phosphor layer is formed in the vicinity of the end face of the LD 11, the problem of temperature rise would not be encountered.

In the design of the light-emitting device wherein the phosphor layer 12 is positioned inside the light path of excitation light and at a region where the density of the excitation light is not higher than 1000 mW/mm$^2$, the configuration of the phosphor layer 12 is required to be designed so as to make it similar to the configuration of the light path of excitation light, provided that the light path of excitation light is directive as in the case of the LD.

Namely, the phosphor layer which is elongated in configuration as shown in FIG. 3 is more preferable than the phosphor layer which is semi-spherical in configuration as shown in FIG. 1. As described above, since the LD light is directive, the LD light emitted from the end face of the LD takes a cone-shaped light path having a spreading called a far field pattern (FFP). In the case of the III-Group nitride LD which is enabled to emit near ultraviolet ray, bluish violet ray or blue ray, the LD light is generally enabled to exist at a high density especially in a cone-shaped region having a spreading angle of about 15-25 degrees in the longitudinal direction and a spreading angle of about 30-50 degrees in the lateral direction. For this reason, it is more preferable to employ an elongated phosphor layer rather than a semi-spherical phosphor layer in order to dispose the phosphor layer inside the light path of LD light.

Figure 4:
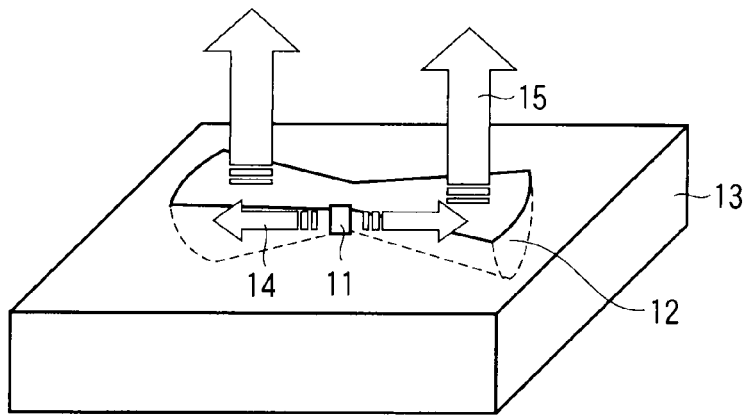
FIG. 4 is a diagram schematically illustrating the construction of a semiconductor light-emitting device according to another embodiment of the present invention.

It is also preferable to form the phosphor layer 12 into a bow-shaped configuration as shown in FIG. 4. As described above, in order to dispose the phosphor layer inside the light path of LD light and also to prevent the phosphor layer 12 from becoming too narrow so as to prevent the incident excitation light from being obstructed, it is preferable to design the phosphor layer 12 so as to have a nearly cone-shaped configuration in conformity with the configuration of the light path. Since the LD 11 is enable to emit the light from the opposite end faces thereof, it is preferable to adopt a bow-shaped phosphor layer 11 in conformity with the inner region of the cone-shaped LD light path.

The embodiment explained herein is based on the assumption that the light emitted from the opposite end faces of the LD 11 is utilized. However, according the gist of the present invention, the phosphor layer may be configured so as to cope with a situation where the light emitted from only one of the end faces of the LD 11 is utilized.

Further, although the above explanation is directed to one embodiment wherein the phosphor layer 12 is disposed inside the light path region where the LD light is existed at a high concentration, what is important is that the phosphor layer 12 to be excited by the excitation light exhibiting a high-output density is formed very thinly and is surrounded by the heat-releasing member 13 exhibiting a high thermal conductance. As long as this inventive concept is not departed, the phosphor layer 12 may be designed into any desired configuration. Namely, for example, the phosphor layer 12 may be separately formed in a plurality of regions inside the light path of the excitation light.

Further, the heat-releasing member 13 also may be designed into any desired configuration as long as the inventive concept of the present invention is not departed. In the aforementioned embodiment, there has been explained a buried structure wherein the heat-releasing member 13 is contacted with approximately a half of the entire circumferential region of the phosphor layer 12. However, the heat-releasing member 13 may be configured so as to protrude into the phosphor layer 12. Alternatively, the heat-releasing member 13 may be configured in such a manner that most of the phosphor layer 12 is covered with the heat-releasing member 13. However, since the present invention is aimed at providing a high-output semiconductor light-emitting device, it is not preferable to employ a structure where the light generated from the phosphor layer 12 cannot be retrieved outward.

Further, since the object of the present invention is to solve the problem of temperature rise of the phosphor layer that has been excited by the excitation light exhibiting a high-output density, the present invention is applicable likewise even to the case where the LED which is inherently low in output as explained above is utilized as an excitation light source, provided that the light output density of the excited phosphor layer is increased close to that of the LD excitation through the employment of a high-output LED or the co-use of a plurality of LEDs. The reason is that the problem of temperature rise would be raised likewise in such a case.

As described above, the output density of the excitation light in the phosphor layer where an LED-excited white light source which is generally used is employed is around 0.5 mW/mm$^2$ in many cases. In view of the output of the ordinary LED, the size of the phosphor layer and the operating conditions, the density of the excitation output of the LED-excited white light source may be confined to about 0.01-10 mW/mm$^2$. As long as the density of the excitation output is confined to this range, the temperature rise of the phosphor layer due to the generation of heat from the phosphor may be confined to not higher than 3° C. or so, thus not raising any substantial problem.

On the other hand, in the case of the LD-excited white light source wherein an high-output LD is employed as an excitation light source, the light output density thereof may be about 20-4000 mW/mm$^2$ as described above. When such a high-output excitation is performed, the temperature of the phosphor layer would be increased up to about 50-500° C. as described above. In view of these facts, as long as the environments of operating the ordinary LED-excited white light source are concerned, the aforementioned problem of heat generation from the phosphor may not give any substantial influence to the device. Whereas, in the case of the light-emitting device where the phosphor is to be excited at a high excitation output density of as high as about 200 mW/mm$^2$ or more, the countermeasures provided by the present invention would become very effective.

Next, various embodiments of the present invention will be explained with reference to drawings.

FIRST EMBODIMENT

As shown in FIG. 3, the semiconductor light-emitting device according to this embodiment is constructed such that an LD 11 is used as an excitation light source, that a narrowly elongated phosphor layer 12 is disposed along the light path of the LD 11 and that the entire surface of the phosphor layer 12 excluding the top surface thereof is covered with a heat-releasing block 13. Namely, a narrowly elongated semi-columnar or boat-like recessed portion is formed on the upper surface of the heat-releasing block 13 made of a heat-releasing member, and the LD 11 used as an excitation light source is disposed at a central portion of the recessed portion, the remaining recessed portion surrounding the LD 11 being filled with the phosphor layer 12.

In this embodiment, the LD 11 is formed of a bluish violet InGaN-based semiconductor laser, the phosphor layer 12 includes a base material made of silicone resin in which a blue color-emitting phosphor and a yellow color-emitting phosphor dispersed, and the heat-releasing member of the heat-releasing block 13 is formed of aluminum. The light to be released outward from the semiconductor light-emitting device according to this embodiment is white light wherein blue light and yellow light are mixed together.

The size of the heat-releasing block is about 5 mm in width, about 10 mm in length and about 6 mm in height. Further, the size of the semi-columnar recessed portion is about 0.6 mm in width, about 7 mm in length and about 4 mm in height. A mounting table (not shown) having a height of about 1 mm is formed at a central portion of the recessed portion in which the LD 11 is to be disposed. This semiconductor light-emitting device is designed such that the light path of LD light having a nature to expand upwardly and downwardly according to the far field image cannot be interrupted by the heat-releasing block 13. Further, the mounting table is also provided with a mechanism to release the heat generated from the LD 11.

N-/p-electrodes (not shown) which are connected with LD 11 are disposed inside the heat-releasing block 13, thereby making it possible to transmit an electric current to the LD 11 and to actuate the LD 11. All of the components including the LD-mounting table, the LD 11 and the electrodes are buried in the semi-columnar phosphor layer 12 contained in the recessed portion.

The phosphor layer 12 is formed of silicone resin in which the phosphor is dispersed. This phosphor layer 12 is only required to be disposed in a region which is spaced away by a distance of not less than 1 mm from the end face of the LD 11. Namely, a silicone resin layer containing no phosphor can be arranged in the region which is distanced by not more than 1 mm from the end face of the LD 11.

Although it is discussed in detail hereinafter, the burying depth and width of the phosphor layer 12 are designed so as to become the same as those of the light path of LD light expanding up and down. Originally, the LD light is enabled to reach to a very long distance. In this embodiment however, since the LD light is transmitted passing through the phosphor layer 12 which is capable of absorbing the excitation light, the LD light which has been emitted from the end face of LD 11 is entirely absorbed in the middle of the phosphor layer 12, thus failing to reach to the end face of the phosphor layer 12. For this reason, when the recessed portion is completely filled with the phosphor layer 12 so as to make the burying height of the phosphor layer 12 the same as the top surface of the heat-releasing block 13, it is possible to prevent the LD light from leaking outward, thus securing the safety. Further, in order to enable the white light-emitting device to actuate in such a manner, the phosphor layer 12 is formed so as to have a sufficient concentration of phosphor to entirely absorb the output of the LD light.

The surface of the aluminum heat-releasing block on the inner surface of the recessed portion is polished to enhance the reflectance. In this semiconductor light-emitting device, the retrieving direction of the white light is directed toward the upper surface of the device. However, since the phosphor that has been excited by the LD light is enabled to release fluorescence omnidirectionally, it is required to reflect all of the lights that have been released in the directions other than the direction toward the upper surface of the device so as to guide these lights to outgo in the direction toward the upper surface of the device, thereby enhancing the light-emitting efficiency of the light-emitting device.

When the LD-excited white light-emitting device having such a configuration as described above is actuated, the LD 11 is actuated at first to enable the LD light 14 to outgo in the horizontal direction from the opposite end faces of the LD 11. In the course of advancement of the LD light 14 in the phosphor layer 12, the LD light 14 is absorbed by the phosphor, thereby exciting the phosphor. Therefore, concomitant with the advancement of the LD light 14, the light output thereof is lowered, thus enabling the LD light 14 to be entirely absorbed as an excitation light by the phosphor layer 12 before reaching to the end portion of the recessed portion. The fluorescence that has been generated from the phosphor layer 12 is enabled to radiate upward from the top surface of the phosphor layer 12 buried in the recessed portion. As described above, the light generated from the phosphor layer 12 and directed in the lateral direction or in the downward direction is reflected by the aluminum surface disposed at the boundary between the inner surface of the recessed portion and the phosphor layer 12, thus enabling these lights to radiate upward and to be retrieved from the top surface of the phosphor layer 12. Since a blue color-emitting phosphor and a yellow color-emitting phosphor are employed in this embodiment, the light generated from the phosphor layer 12 is recognized as white light 15 as it is viewed from outside.

As described above, according to this embodiment, it is possible to realize a white light-emitting device where the LD 11 is employed as an excitation light source. In different from the conventional LED excitation, the white light-emitting device according to this embodiment employs the LD 11 which is high in output and in conversion efficiency, so that it is possible to realize a high-output and high efficiency white light-emitting device. Further, since the number of the semiconductor light-emitting element which is required for securing a high-output can be reduced, it is possible to miniaturize the package size.

The LD-excited white light-emitting device according to this embodiment was found to exhibit about 40° C. in maximum temperature of the phosphor layer 12 as it was operated at an output of as high as 2000 mW as actuated with one side of the LD light. As long as the temperature rise is confined to this degree, the deterioration rate of the conversion efficiency of phosphor is minimal, so that the base material of the phosphor layer 12 can be prevented from being denatured and degraded.

Aluminum is employed as a material for the heat-releasing block 13 in this embodiment. However, there is not necessarily any reason to exclude other materials exhibiting heat-releasing properties as long as the gist of the present invention is not departed. For example, it is possible to employ a metallic material such as copper, silver, etc. or a semiconductor material such as Si, AlN, etc. In order to sufficiently secure the heat-releasing property, it is preferable to employ a material having a heat conductance which is not less than 5 times as high as that of the base material of the phosphor layer 12.

Further, although it is designed such that the heat generation of the LD 11 itself can be dissipated through the table mounting the LD 11, it is not preferable to permit the heat generated from the phosphor layer 12 to propagate to the LD 11. Therefore, it is preferable to dispose a silicone resin layer containing no phosphor in the neighborhood of the LD 11 as described in this embodiment. Namely, it is preferable to adopt a structure avoiding any possibility of being influenced by the heat generated from the phosphor due to the existence of the phosphor in the neighborhood of the LD 11 or in a region distanced by not more than 1 mm from the end face of the LD 11. The reason is that if the phosphor is permitted to exist in a region distanced by not more than 1 mm from the end face of the LD 11, the excitation light density may become too high, so that it is no longer possible to prevent the temperature rise by means of the heat-releasing block. By constructing the device in this manner, it is now possible to avoid the influence of the heat generated at the phosphor layer 12 on the LD 11.

As described above, since the material generally employed as a base material of the phosphor layer 12 is very low in heat conductance, when a layer formed of such a material and containing no phosphor is disposed in a region between the end face of the LD 11 and a location distanced at least by 1 mm from the end face of the LD 11, it is possible to sufficiently prevent the propagation of heat from the region of the phosphor layer 12 containing the phosphor and being heated by the excitation light to the LD 11. For this reason, it is preferable to dispose the silicone resin layer containing no phosphor in a region distanced by not more than 1 mm from the end face of the LD 11.

Further in this case, when the refractive index of the phosphor layer 12 is made larger than the refractive index of the silicone resin layer containing no phosphor and formed in the neighborhood of the LD 11, the propagating angle of the exciting LD light inside the phosphor layer 12 can be narrowed. By constructing the light-emitting device in this manner, it is possible to enhance the incident efficiency of the excitation light into the phosphor layer 12, thereby making it possible to enhance the light-emitting efficiency of the light-emitting device.

Further, when the end face of the phosphor layer 12 is formed into a convex configuration protruding toward the LD 11, it is possible to narrow the propagating angle of the exciting LD light inside the phosphor layer 12, thereby making it possible to enhance the light-emitting efficiency of the light-emitting device.

SECOND EMBODIMENT

Figure 5:
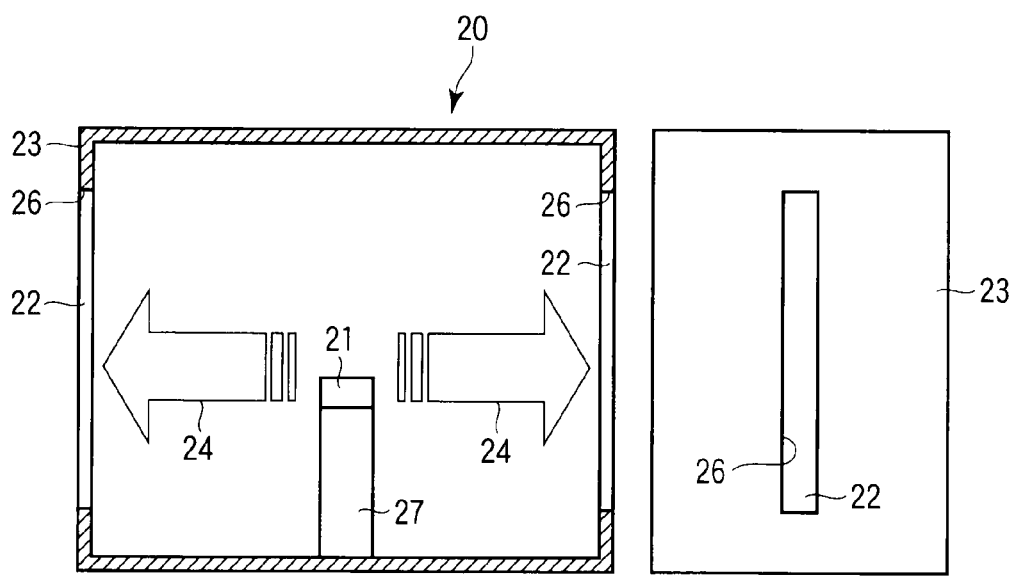
FIG. 5 is a diagram schematically illustrating the construction of a semiconductor light-emitting device according to a second embodiment of the present invention.

FIG. 5 shows a diagram schematically illustrating the construction of a semiconductor light-emitting device wherein an LD 21 is employed as an excitation light source and a portion of the phosphor layer 22 is in contact with a heat-releasing member. The main body 20 of the device is formed of a rectangular parallelepiped having a size of: 3 mm×6 mm×6 mm and most of the main body 20 is formed of AlN which is excellent in thermal conductance. The LD 21 which is mounted on a table 27 disposed at a central portion in the main body 20 is enabled to radiate exciting LD light 24 in the rightward and leftward directions. The main body 20 is provided, in the right and left walls thereof, with a slit 26 having a size of 0.3 mm×3 mm. The phosphor layer 22 is formed in this slit 26.

In this device, the exciting LD light from the LD 21 is permitted to enter into the faces of the phosphor layer 22 which are located inside the main body 20 of device to thereby excite the phosphor, thus generating excited white light which is then taken out of the main body 20 of device through the opposite faces of the phosphor layer 22. The interior of the main body 20 of device is air-tightly filled with nitrogen gas to thereby suppress the deterioration of the LD 21.

In this case, the distance between the end face of the LD 21 disposed at a central portion of the main body 20 and the phosphor layer 22 is about 2.5 mm. Due to this positional relationship, the phosphor layer 22 is enabled to be formed inside the light path of the exciting LD light, thus agreeing with the gist of the present invention.

Due to the specific construction according to this embodiment as explained above, it is possible, even if the LD 21 is actuated at a high output, to enable the heat generated from the phosphor layer 22 to propagate to the wall 23 contacting with the phosphor layer 22 and formed of a heat-releasing member, thereby making it possible to suppress the temperature rise of the phosphor layer 22. Because of this, it is now possible to realize an LD-excited white light-emitting device which is high in output and in light-emitting efficiency. This white light-emitting device which is miniaturized in size and high in output as described above is applicable, as various kinds of light sources, to an on-vehicle head lamp, a backlight for liquid crystal, general lighting, etc.

In this embodiment, the size of the slit is set to 0.3 mm×3 mm. However as explained above, the size of the slit may not be restricted to this embodiment as long as the size thereof confined within the range which does not depart from the gist of the present invention. Further, with respect to the entire size of the device, it may not be restricted to the size illustrated in this embodiment.

Although a slit is formed as a rectangular configuration in this embodiment, the configuration of the slit may be optionally selected as long as it does not depart from the gist of the present invention. For example, it may be oval, rectangular having round corners, triangular, circular or star-like in configuration. Further, the slit may be divided into plural portions. It is possible to form the slit so as to attach importance to the designing thereof.

In this embodiment, the phosphor layer 22 is configured in such a manner that the width of the incidence side of exciting LD light is made equal to the width of the excited light-outgoing side. The configuration of the phosphor layer 22 may be optionally selected as long as it does not depart from the gist of the present invention. For example, the phosphor layer 22 may be formed into a tapered configuration wherein the width of the incidence side of exciting LD light is made smaller and the width of the excited light-outgoing side is made larger. When the phosphor layer 22 is formed in this manner, the excited light-retrieving efficiency can be increased and the conversion efficiency of the device can be enhanced as a whole. Further, in this embodiment, the phosphor layer is formed inside the slit. However, the phosphor layer may be optionally arranged as long as it does not depart from the gist of the present invention. For example, the phosphor layer may be formed outside the slit or it may be formed not only the inside but also the outside of the slit.

In this embodiment, AlN is employed as a material for a heat-releasing member. However, it is possible to employ other materials as long as the heat-releasing property thereof does not depart from the gist of the present invention. For example, it is possible to employ a metallic material such as copper, silver, aluminum, etc. or a semiconductor material such as Si, etc. In order to sufficiently secure the heat-releasing property, it is preferable to employ a material having a heat conductance which is not less than 5 times as high as that of the base material constituting the phosphor layer.

In the first and second embodiments of the present invention explained above, a blue light-emitting fluorescent material and a yellow light-emitting fluorescent material are employed as the phosphor. However, depending on the application of the device, it is possible to employ any kind of fluorescent material selected from a blue light-emitting fluorescent material, a green light-emitting fluorescent material, a yellow light-emitting fluorescent material, a red light-emitting fluorescent material and a white light-emitting fluorescent material. As for the material for the phosphor, it is preferable to employ any one of the material selected from a silicate-based fluorescent material, an aluminate-based fluorescent material, a nitride-based fluorescent material, a sulfide-based fluorescent material, an oxysulfide-based fluorescent material, a YAG-based fluorescent material, a phosphate-based fluorescent material, a borate-based fluorescent material, a halo-phosphate-based fluorescent material. However, it is also possible to employ other materials as long as they do not depart from the gist of the present invention.

Although silicone resin is employed as a base material for the phosphor layer containing a phosphor in the first and second embodiments, it is possible to employ other materials such as resin, glass, sintered bodies and ceramic materials. Namely, any kinds of materials can be employed as long as they do not depart from the gist of the present invention.

Further, although a bluish violet InGaN-based semiconductor laser is employed as a semiconductor light-emitting element in the first and second embodiments, it is possible to employ a near-ultraviolet semiconductor LD or a blue semiconductor LD. Further, it is also possible to employ LDs exhibiting other wavelength or made of other materials as long as they do not depart from the gist of the present invention. Furthermore, as described above, it is possible to employ LEDs as long as they are capable of realizing such a high-output excitation that may give rise to a problem of influence due to the heat generation in a phosphor.

In the first and second embodiments, although the light-emitting device is designed such that the light released outward from it is white light, it is also possible to design the light-emitting device so as to enable it to radiate visible light of other wavelengths, infrared light or ultraviolet light depending on the end-use thereof.

In the first and second embodiments, although the concentration of phosphor in the phosphor layer 12 is made constant, the concentration thereof may be non-uniform as long as it does not depart from the gist of the present invention. In view of the fact that the LD-excited light attenuates due to the absorption thereof by the phosphor in the course of advancement thereof in the phosphor layer 12 from the end face of the LD 11 to the end of the recessed portion, the density of the excitation light in phosphor layer 12 is caused to decrease as the LD-excited light advances far away from the LD 11. Because of this, it is preferable to suitably distribute the concentration of phosphor to be contained in the phosphor layer 12 in order to obtain a uniform output of white light without non-uniformity thereof throughout the device. For example, since the density of output of excitation light becomes higher in a region nearer to the LD 11 and become lower in a region spaced far away from the LD 11, the concentration of phosphor should be made thinner in a region nearer to the LD 11 and thicker in a region spaced far away from the LD 11.

What is claimed is:

1. A semiconductor light-emitting device comprising:
   a semiconductor light-emitting element;
   a phosphor layer disposed in a light path of a light emitted from the semiconductor light-emitting element, containing a phosphor to be excited by the light and having a cross-section in a region of a diameter which is 1 mm larger than that of a cross-section of the light path; and
   a heat-releasing member disposed in contact with at least a portion of the phosphor layer and exhibiting a higher thermal conductance than that of the phosphor layer.

2. The device according to claim 1, wherein the phosphor layer has a cross-section in a region of the cross-section of the light path.

3. The device according to claim 1, wherein the semiconductor light-emitting element is a semiconductor laser.

4. The device according to claim 1, wherein the semiconductor light-emitting element is a high-output semiconductor light-emitting diode.

5. The device according to claim 1, which is provided with a plurality of the semiconductor light-emitting elements.

6. The device according to claim 1, wherein the phosphor layer is arranged at a position apart from the semiconductor light-emitting element, where maximum density of light emitted from the semiconductor light-emitting element is not more than 1000 mW/mm$^2$.

7. The device according to claim 1, wherein the semiconductor light-emitting element is formed of a III-Group nitride compound semiconductor.

8. The device according to claim 1, wherein at least a portion of the light emitted from the phosphor layer is visible light.

9. The device according to claim 1, wherein the heat-releasing member is formed of metal.

10. The device according to claim 1, wherein the phosphor layer has a volume concentration distribution of the phosphor which is higher in a region distal to the semiconductor light-emitting element and is lower in a region proximal to the semiconductor light-emitting element.

11. The device according to claim 8, wherein a layer containing no phosphor is disposed in a region of the light path which is located not more than 1 mm away from a light-emitting face of the semiconductor light-emitting element.

12. The device according to claim 1, wherein a base material of the phosphor layer is formed of a material selected from the group consisting of a transparent resin, glass, a sintered body and a ceramic material.

13. The device according to claim 1, wherein the phosphor is formed of a material selected from the group consisting of a silicate-based fluorescent material, an aluminate-based fluorescent material, a nitride-based fluorescent material, a sulfide-based fluorescent material, an oxysulfide-based fluorescent material, a YAG-based fluorescent material, a phosphate-based fluorescent material, a borate-based fluorescent material, and a halo-phosphate-based fluorescent material.

14. The device according to claim 1, wherein the phosphor is formed of a material selected from the group consisting of a blue light-emitting fluorescent material, a yellow light-emitting fluorescent material, a green light-emitting fluorescent material, a red light-emitting fluorescent material and a white light-emitting fluorescent material.

15. The device according to claim 1, wherein the phosphor layer has a columnar shape elongated along the light path.

16. The device according to claim 1, wherein the phosphor layer has a shape similar to the light path and has a long cone-shape extending along the light path.

17. The device according to claim 1, wherein the phosphor layer has a light incident surface of a convex shape.

18. The device according to claim 1, wherein a layer formed of a material exhibiting a smaller refractive index than that of the phosphor layer is interposed between the semiconductor light-emitting element and the phosphor layer.

19. The device according to claim 1, further comprising a rectangular parallelepiped housing having a wall, in which the semiconductor light-emitting element is arranged, wherein a portion of the wall which faces the light-emitting face of the semiconductor light-emitting element is formed of the heat-releasing member, the wall has a slit in a light incident region, and the phosphor layer is arranged in the slit.

* * * * *